(12) United States Patent
Matsumoto

(10) Patent No.: US 9,419,068 B2
(45) Date of Patent: Aug. 16, 2016

(54) ORGANIC EL DISPLAY DEVICE AND METHOD OF MANUFACTURING ORGANIC EL DISPLAY DEVICE

(71) Applicant: Japan Display Inc., Tokyo (JP)

(72) Inventor: Yuko Matsumoto, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/678,021

(22) Filed: Apr. 3, 2015

(65) Prior Publication Data
US 2015/0289343 A1    Oct. 8, 2015

(30) Foreign Application Priority Data

Apr. 8, 2014   (JP) .................................. 2014-079181

(51) Int. Cl.
| | |
|---|---|
| H05B 33/14 | (2006.01) |
| H05B 33/06 | (2006.01) |
| H05B 33/04 | (2006.01) |
| H05B 33/10 | (2006.01) |
| H01L 27/32 | (2006.01) |

(52) U.S. Cl.
CPC ........ *H01L 27/3297* (2013.01); *H01L 27/3276* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | |
|---|---|---|
| 2011/0163331 A1 | 7/2011 | Yamazaki et al. |
| 2012/0205675 A1 | 8/2012 | Yamazaki et al. |

FOREIGN PATENT DOCUMENTS

JP    2009-295911 A    12/2009

*Primary Examiner* — Ashok Patel
(74) *Attorney, Agent, or Firm* — Typha IP LLC

(57) ABSTRACT

An organic EL display device includes: a lower electrode disposed in each of pixels; an upper electrode disposed so as to cover the whole of the display area; an organic layer disposed between the lower electrode and the upper electrode and composed of a plurality of layers including a light-emitting layer composed of an organic material; a wire formed outside the display area and composed of conductive material; and a tapered structure layer formed on the wire and including tapered portions at each of which a side surface portion not in contact with the wire extends so as to overhang the wire. At least one layer of the organic layer is formed on the tapered structure layer. The tapered structure layer forms a contact hole surrounded by the side surface portions. The upper electrode is in contact with the wire through the contact hole.

7 Claims, 10 Drawing Sheets

ORGANIC EL DISPLAY DEVICE AND METHOD OF MANUFACTURING ORGANIC EL DISPLAY DEVICE

CROSS-REFERENCE TO RELATED APPLICATION

The present application claims priority from Japanese application JP2014-079181 filed on Apr. 8, 2014, the content of which is hereby incorporated by reference into this application.

BACKGROUND OF THE INVENTION

1. Field of the Invention

The present invention relates to an organic EL display device and a method of manufacturing an organic EL display device.

2. Description of the Related Art

In recent years, an image display device (hereinafter referred to as an "organic EL display device") using a self-luminous body called an organic light-emitting diode has been put to practical use. Since the self-luminous body is used, the organic EL display device is superior in terms of visibility and response speed compared to a related-art liquid crystal display device, and in addition, a further reduction in thickness is possible in the organic EL display device because an auxiliary lighting device such as a backlight is not necessary.

JP 2009-295911 A discloses that a peripheral portion of a planarization film composed of an organic material is covered, outside a display area, with a charge transport layer including any one of an alkali metal and an alkaline-earth metal to thereby suppress the entry of moisture or gas into an organic layer.

In the organic EL display device, an upper electrode, which is one of two electrodes, upper and lower electrodes, that interpose an organic layer including a light-emitting layer therebetween, is an electrode covering the entire surface of a display area in which the organic layer is formed, and the upper electrode is formed from a transparent conductive material. The upper electrode is connected to a wire outside the display area. For performing the connection outside the display area, a vapor deposition step or the like using a vapor deposition mask is performed in a manufacturing step so as to prevent the organic layer, which is deposited before the upper electrode, from being vapor-deposited outside the display area. However, a vapor deposition mask requires highly accurate processing, is expensive, and needs to be regularly cleaned and exchanged. Therefore, the vapor deposition step using a vapor deposition mask increases the number of man-hours of work, leading to an increase in manufacturing cost.

SUMMARY OF THE INVENTION

The invention has been made in view of the circumstances described above, and it is an object of the invention to provide an organic EL display device whose manufacturing cost is further reduced, and a method of manufacturing an organic EL display device whose manufacturing cost is further reduced.

An organic EL display device according to an aspect of the invention includes: a plurality of pixels disposed in a matrix in a display area; a lower electrode disposed in each of the plurality of pixels and composed of a conductive material; an upper electrode disposed so as to cover the whole of the display area and composed of a conductive material; an organic layer disposed between the lower electrode and the upper electrode and composed of a plurality of layers including a light-emitting layer composed of an organic material; a wire formed outside the display area and composed of conductive material; and a tapered structure layer formed on the wire and including tapered portions at each of which a side surface portion not in contact with the wire extends so as to overhang the wire, wherein at least one layer of the organic layer is formed on the tapered structure layer, the tapered structure layer forms a contact hole surrounded by the side surface portion, and the upper electrode is in contact with the wire through the contact hole.

In the organic EL display device according to the aspect of the invention, the organic EL display device may further include an island-shaped portion disposed on the wire between the tapered portions that face each other, having a layer configuration of at least one layer of the organic layer, and covered with the upper electrode.

In the organic EL display device according to the aspect of the invention, the tapered structure layer may have a layer configuration of the lower electrode.

In the organic EL display device according to the aspect of the invention, a plurality of the contact holes may be formed, in which case the plurality of contact holes each may have a strip shape extending in one direction and be arranged in parallel. Moreover, the plurality of contact holes may be disposed in a matrix.

A method of manufacturing an organic EL display device according to another aspect of the invention includes: a wire forming step of forming, outside a display area, a wire composed of a conductive material; a layer-to-be-etched forming step of depositing a layer to be etched on the wire; a tapered structure layer forming step of selectively overetching the layer to be etched to thereby form a hole to expose the wire, and form tapered portions at each of which a side surface portion forming the hole extends so as to overhang the wire; an organic layer deposition step of depositing, after the tapered structure layer forming step, an organic layer composed of an organic material on the tapered structure layer; and an upper electrode forming step of depositing, after the organic layer deposition step, an upper electrode composed of a conductive material, wherein the organic layer deposited in the organic layer deposition step is deposited while being disconnected at the hole, and the upper electrode deposited in the upper electrode forming step is connected with the wire at the hole.

In the method of manufacturing an organic EL display device according to the aspect of the invention, the method may further include: after the upper electrode forming step, a sealing film forming step of forming a sealing film from an inorganic material so as to cover the display area and the outside of the display area; and an external terminal forming step of partially removing, by etching, at least the sealing film, the upper electrode, and the organic layer to expose an external terminal for inputting and outputting signals to and from the outside of the device.

In the method of manufacturing an organic EL display device according to the aspect of the invention, the tapered structure layer forming step may be a step of forming a lower electrode to be paired with the upper electrode to cause a light-emitting layer composed of an organic material to emit light.

DETAILED DESCRIPTION OF THE INVENTION

Figure 1:
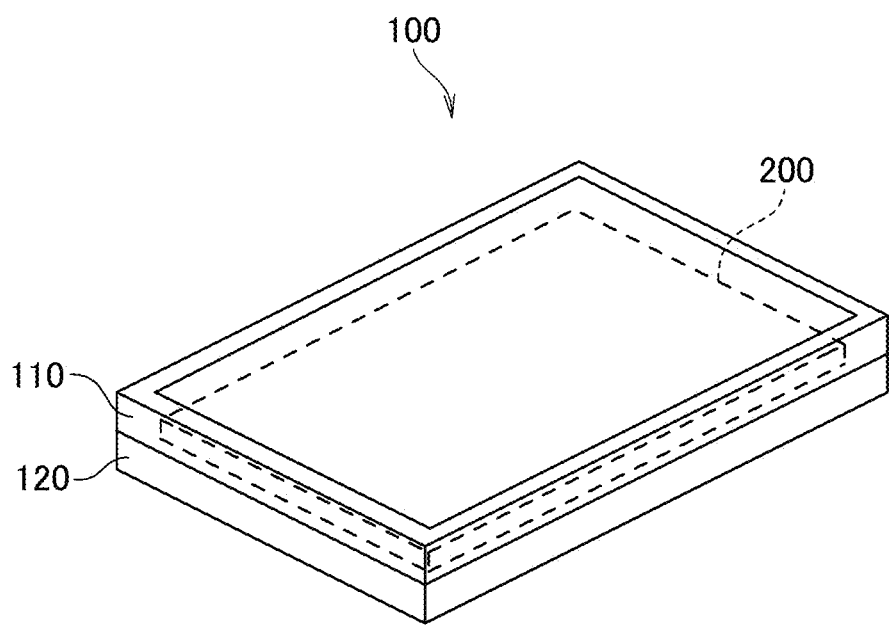
FIG. 1 is a diagram schematically showing an organic EL display device according to an embodiment of the invention.

Hereinafter, embodiments of the invention will be described with reference to the drawings. The disclosure is illustrative only. Appropriate modifications that will readily occur to those skilled in the art and fall within the gist of the invention are of course included in the scope of the invention. In the drawings, the width, thickness, shape, and the like of each part may be schematically represented, compared to those in practicing aspects of the invention, for more clarity of description. However, they are illustrative only, and do not limit the interpretation of the invention. Moreover, in the specification and the drawings, elements similar to those described relating to a previous drawing are denoted by the same reference numerals and signs, and a detailed description may be appropriately omitted.

FIG. 1 schematically shows an organic EL display device 100 according to an embodiment. As shown in the drawing, the organic EL display device 100 is composed of an organic EL panel 200 fixed so as to be interposed between an upper frame 110 and a lower frame 120. The organic EL display device 100 may be embodied in other forms such as, for example, in a form of being fixed only to the lower frame 120.

Figure 2:
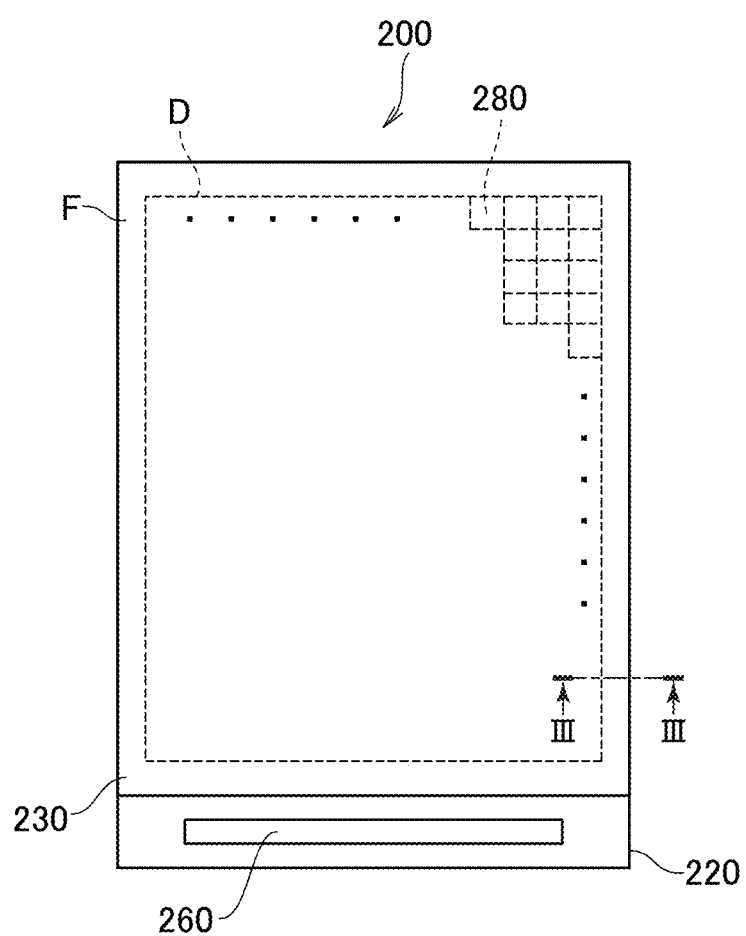
FIG. 2 is a diagram showing a configuration of an organic EL panel in FIG. 1.

FIG. 2 shows a configuration of the organic EL panel 200 in FIG. 1. The organic EL panel 200 includes two substrates, a TFT (Thin Film Transistor) substrate 220 and a counter substrate 230. A space between the substrates is filled with a transparent resin. The TFT substrate 220 includes pixels 280 disposed in a matrix in a display area D. Here, an area outside the display area is defined as an outside area (picture-frame area) F. A driver IC (Integrated Circuit) 260 is placed on the TFT substrate 220. The driver IC 260 is a driver circuit that applies, to a scanning signal line of a pixel transistor composed of a TFT disposed in each of the pixels 280, a potential for providing electrical conduction between a source and a drain. Also, the driver IC 260 applies, to a data signal line of each of the pixel transistors, a voltage corresponding to the gray-scale value of the pixel. For the TFT, LTPS semiconductor, amorphous semiconductor, oxide semiconductor, and other semiconductors can be used. Although, in FIG. 2, the organic EL panel 200 is configured to include the counter substrate 230, the organic EL panel 200 may not include the counter substrate 230 and may be configured without using the transparent resin between the substrates. For the substrate, a material having pliability or flexibility, such as plastic, can be used in addition to glass. The driver circuit may be a circuit formed of thin film transistors a portion or all of which are formed on the TFT substrate 220.

In the organic EL panel 200 according to the embodiment, a light-emitting element of each of the pixels 280 disposed in the display area D of the TFT substrate 220 emits white light, which is caused to transmit as lights of four colors, red (R), green (G), blue (B), and white (W), in the counter substrate 230, thereby making it possible to perform color display. However, three colors of RGB or a combination of other colors may be used, and the light-emitting element in the TFT substrate 220 may emit, not the single white light, but a plurality of colored lights to thereby perform color display. In this case, the counter substrate 230 can be configured without using a color filter.

Figure 3:
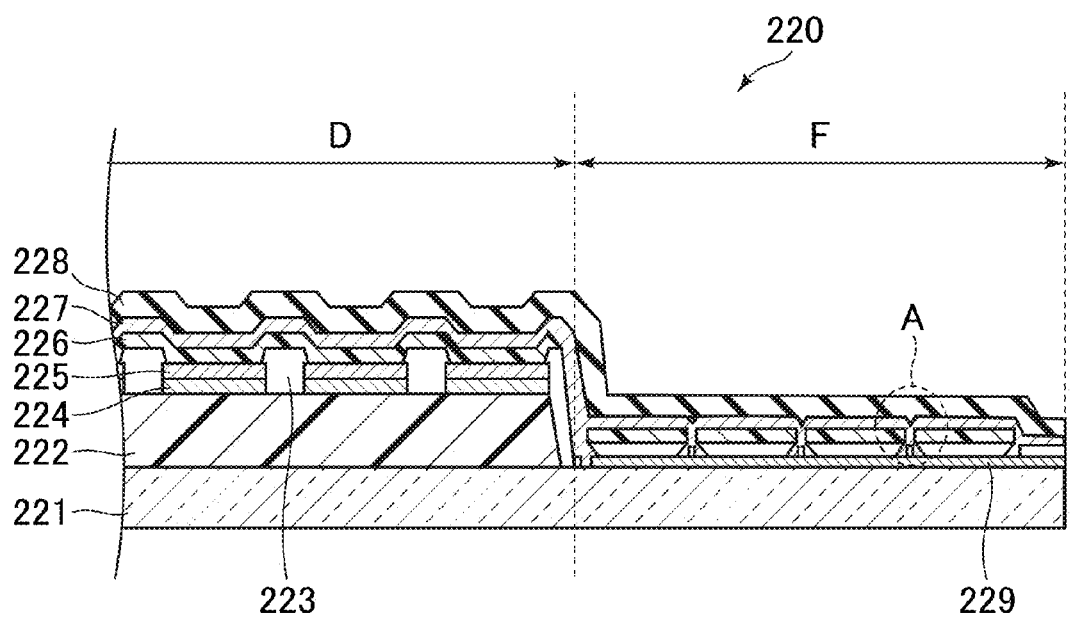
FIG. 3 is a diagram schematically showing a cross-section of a TFT substrate taken along the line III-III in FIG. 2.

FIG. 3 is a diagram schematically showing a cross-section of the TFT substrate 220 taken along the line III-III in FIG. 2. As shown in the drawing, FIG. 3 shows a cross-section from the display area D over the outside area F as an area outside the display area. In the display area D, TFT circuits (not shown) are formed on a base material 221 formed of an insulating material such as glass, and a planarization film 222 composed of an organic material for forming an organic EL element is formed on the TFT circuits. Further, a reflection film 224, lower electrodes 225, and a pixel separation film 223 are formed on the planarization film 222. The reflection film 224 reflects light emitted in a light-emitting layer of the organic EL element. The lower electrode 225, to which a potential controlled by the TFT circuit in each of the pixels 280 is applied, is disposed on the reflection film 224. The pixel separation film 223 covers edges of the lower electrodes 225 to insulate between the lower electrodes 225 next to each other. On the lower electrode 225 and the pixel separation film 223, an organic layer 226 composed of a plurality of layers including the light-emitting layer composed of an organic material is deposited on the entire surface of the display area D. On the organic layer 226, an upper electrode 227 and a sealing film 228 are deposited. The upper electrode 227 is composed of, for example, indium tin oxide, indium zinc oxide, or other light transmissive, conductive materials. The sealing film 228 is composed of an inorganic insulating material such as, for example, SiN or SiO, and blocks the entry of moisture.

In FIG. 3, the lower electrode 225 and the reflection film 224 are separately provided. However, the reflection film 224 may not be formed, in which case the lower electrode 225 also serves as the reflection film 224. Moreover, the plurality of layers included in the organic layer 226 may include a layer composed of an inorganic material. Moreover, as the TFT circuit, a circuit suitable for light emission control of the organic EL display device 100, including a well-known circuit, can be appropriately used. In the outside area F, a wire 229 for applying a constant potential to the upper electrode 227 is formed, and connected at a plurality of points with the upper electrode 227.

Figure 4:
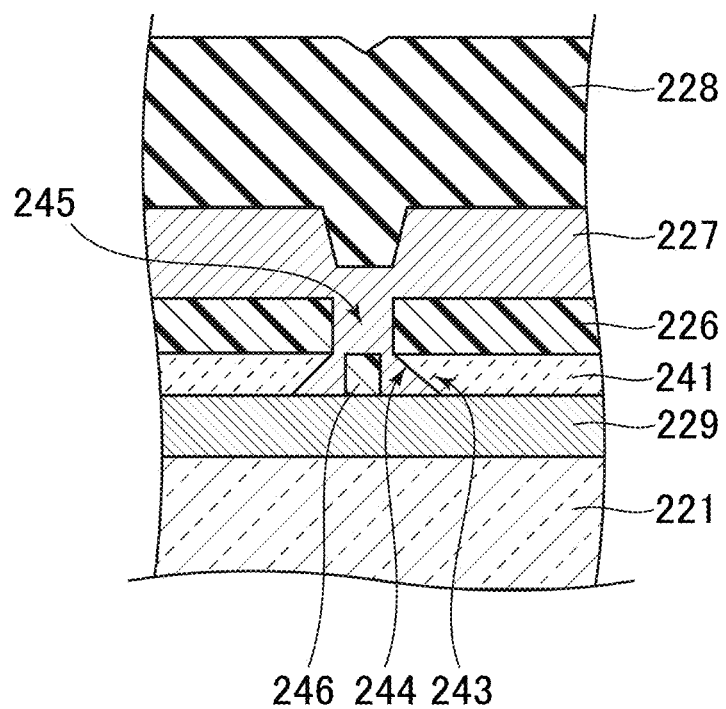
FIG. 4 is an enlarged schematic view showing an area A of an outside area F in FIG. 3.

FIG. 4 is an enlarged schematic view showing an area A of the outside area F in FIG. 3. As shown in the drawing, a tapered structure layer 241 including tapered portions 243 at each of which a side surface portion 244 of an edge extends so as to overhang the wire is formed on the wire 229. The organic layer 226 is formed on the tapered structure layer 241. The tapered portions 243 are disposed so as to face each other, between which a contact hole 245 to the wire 229 is provided. The upper electrode 227 is disposed on the organic layer 226, and also, the upper electrode 227 is deposited in the contact hole 245, so that the upper electrode 227 is electrically connected to the wire 229. The sealing film 228 is formed on the upper electrode 227. Here, an island-shaped portion 246 having the layer configuration of the organic layer 226 and covered with the upper electrode 227 may be formed on the wire 229 between the tapered portions 243 facing each other. Here, the tapered structure layer 241 can have the layer configuration of the lower electrode 225. When the tapered structure layer 241 has the layer configuration of the lower electrode 225, the tapered structure layer 241 can be deposited simultaneously with the lower electrode 225. Therefore, the manufacturing step can be reduced, and the manufacturing cost can be suppressed. However, the tapered structure layer 241 is not limited to the same layer configuration as that of the lower electrode 225, and may include any of an inorganic material, an organic material, a conductive material, and a non-conductive material. The organic layer 226 in the outside area F may be composed of a portion of the plurality of layers included in the organic layer 226 in the display area D. Moreover, the lower electrode 225 and/or the tapered structure layer 241 can have, for example, a stacked structure of ITO/Ag/ITO, Ti/Al/Ti, or Mo/W/Ti, or other stacked structures.

Figure 5:
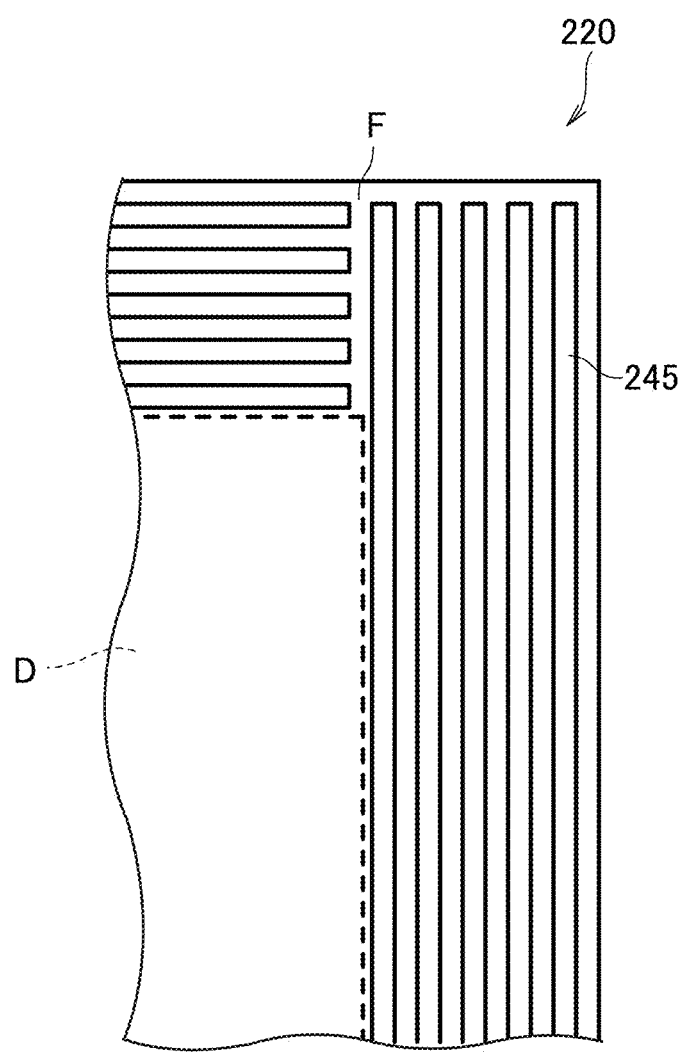
FIG. 5 is a partial plan view showing an example of arrangement of contact holes.

FIG. 5 is a partial plan view showing an example of arrangement of the contact holes 245. In the example shown in the drawing, a plurality of contact holes 245 extend in a strip shape and are arranged in parallel in the outside area F. Although, in FIG. 5, the contact holes 245 extending in a strip shape are shown, the contact holes 245 may be formed such that the contact holes 245 extending in different directions are connected at the corner portions of the TFT substrate 220 and surround three or four sides of the display area D.

Figure 6:
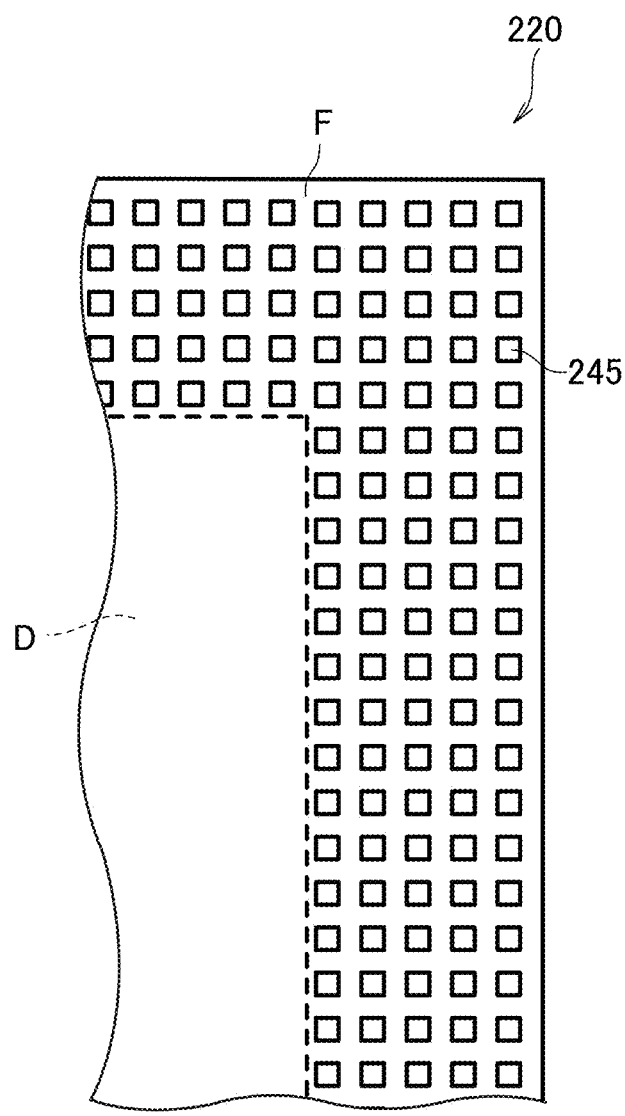
FIG. 6 is a partial plan view showing another example of arrangement of contact holes.

FIG. 6 is a partial plan view showing another example of arrangement of the contact holes 245. In the example shown in the drawing, rectangular contact holes 245 are disposed in a matrix in the outside area F. Here, the shape of each of the contact holes 245 is not limited to a rectangle, and the contact hole 245 may have other shapes such as a circle. The arrangement of the contact holes 245 is not limited to the examples in FIGS. 5 and 6, and the contact holes 245 can be appropriately disposed according to the size of the outside area F, the area necessary for the contact holes, and the like. As shown in the examples in FIGS. 5 and 6, by forming the contact holes 245 at a plurality of points, the connection between the upper electrode 227 and the wire 229 can be assured more reliably, and also, the potential of the upper electrode 227 can be made uniform in the display area D. Moreover, by properly determining the shape or number of the contact holes, the contact area between the upper electrode 227 and the wire 229 can be increased, power consumption can be suppressed, and the potential of the upper electrode can be made more uniform.

Figure 7:
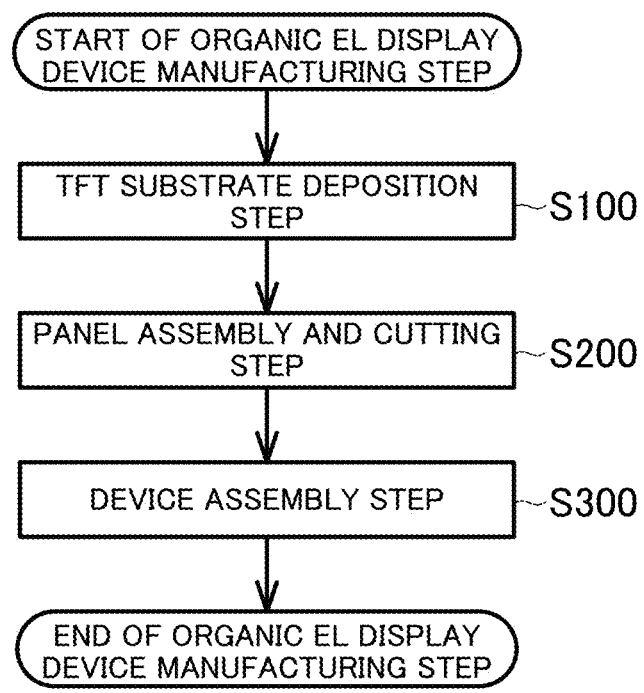
FIG. 7 is a flowchart showing the outline of a manufacturing step of the organic EL display device.

FIG. 7 is a flowchart showing the outline of the manufacturing step of the organic EL display device 100. As shown in the flowchart, the manufacturing step of the organic EL display device 100 includes: a TFT substrate deposition step S100 in which layers of the TFT circuit are formed on an insulating substrate serving as a base material, and the layers of the organic EL element are formed; a panel assembly and cutting step S200 for assembling the organic EL panel in which the organic EL panel 200 is formed by, for example, bonding the counter substrate 230 to the TFT substrate 220, cutting the substrates, and then placing the driver IC 260 or the like; and a device assembly step S300 in which the frames such as the lower frame 120 are combined together to form the organic EL display device 100. When the configuration of the organic EL display device 100 is different such as the case where, for example, the organic EL display device 100 is formed from a base material having pliability, the contents and combination of the manufacturing step can be made different.

Figure 8:
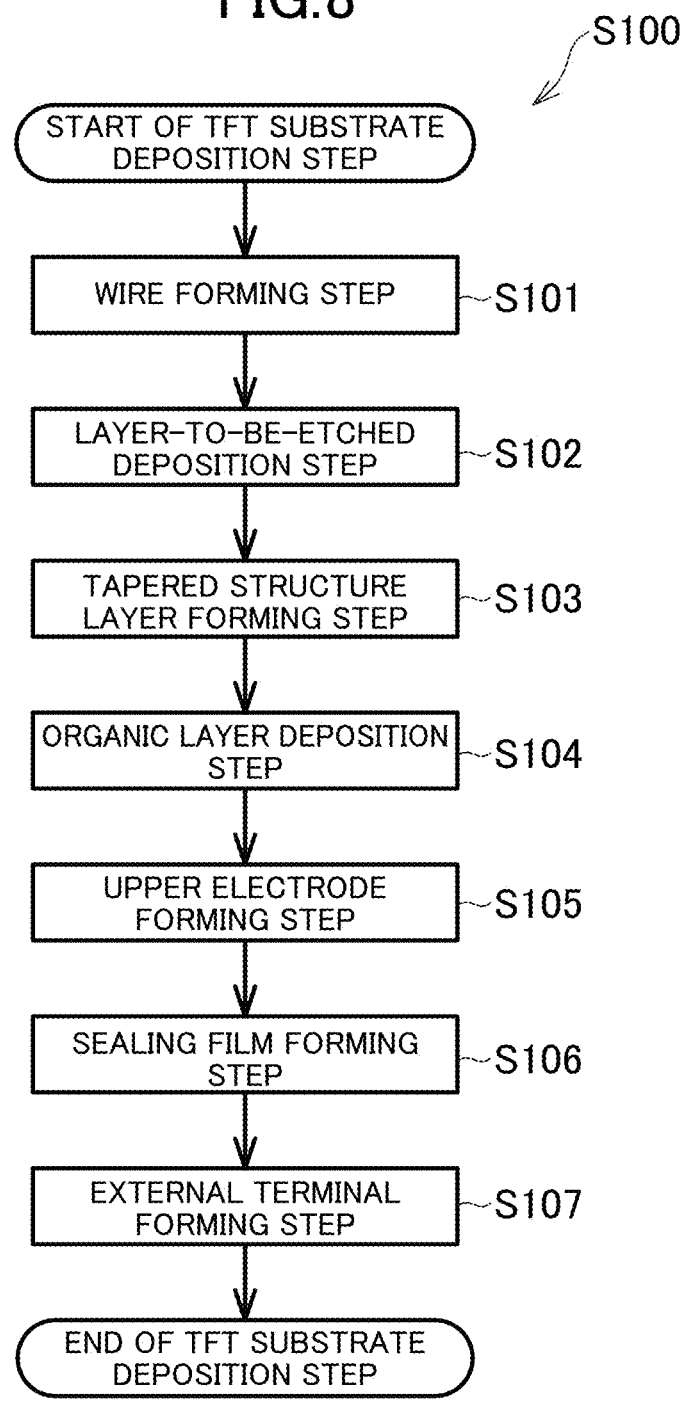
FIG. 8 is a flowchart showing more in detail a TFT substrate deposition step in FIG. 7.

FIG. 8 is a flowchart showing in more detail the TFT substrate deposition step S100 in FIG. 7. The flowchart focuses on deposition in the outside area F, and steps and the like in the display area D that are not included in the flowchart can be appropriately combined. In the TFT substrate deposition step S100, first, the wire 229 is formed in a wire forming step S101. In the formation of the wire 229, the wire 229 is deposited simultaneously with a wire in the display area D, for example, a wire of the TFT circuit, and can be formed by a photolithography step or the like. Next, in a layer-to-be-etched deposition step S102, a layer to be etched 251 (described later) that becomes the tapered structure layer 241 after etching is deposited. Here, the layer to be etched 251 can be deposited simultaneously with and from the same material as the lower electrode 225. Due to the simultaneous deposition with the lower electrode 225, the manufacturing step can be reduced, and the manufacturing cost can be suppressed. However, the layer to be etched 251 may have a different layer configuration from the lower electrode 225 and may be deposited at different timing from the lower electrode 225.

Figure 9:
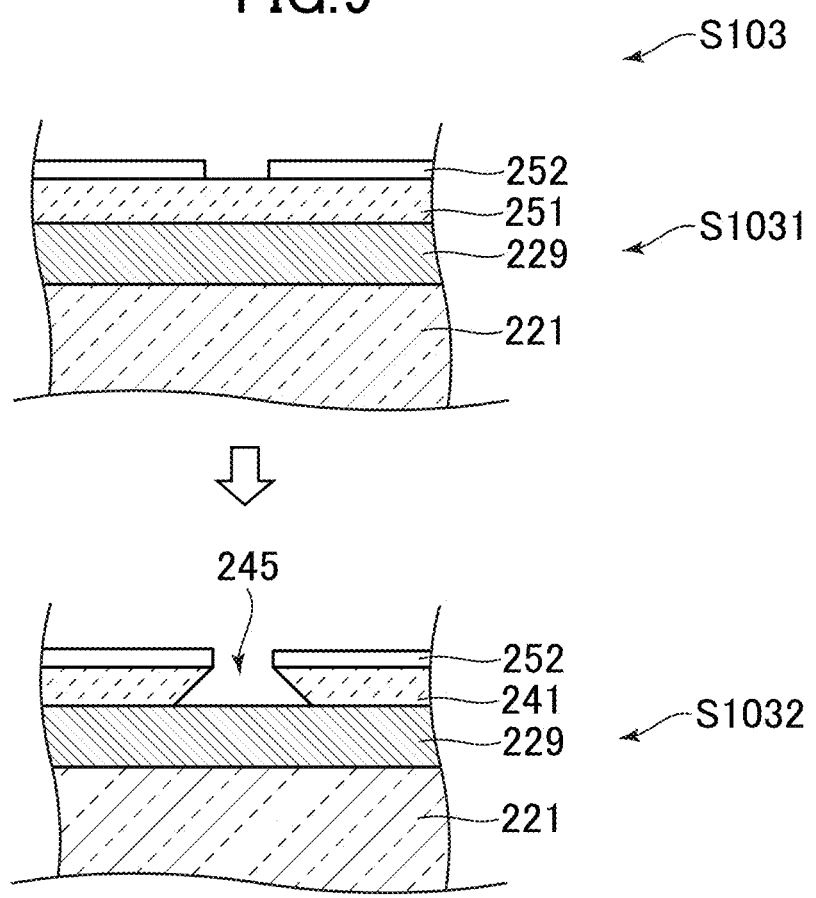
FIG. 9 is a diagram for explaining a tapered structure layer forming step in FIG. 8.

FIG. 9 is a diagram for explaining a tapered structure layer forming step S103 in FIG. 8. In the tapered structure layer forming step S103, an etching mask 252 is formed using a photolithography step or the like (S1031), and a hole is opened through the layer to be etched 251 by wet etching. Here, the layer to be etched 251 is overetched, whereby the tapered portion 243 at which the side surface portion 244 extends so as to overhang the wire is formed, so that the tapered structure layer 241 is provided. The tapered portions 243 are formed so as to face each other, between which the contact hole 245 is provided (S1032). When the layer to be etched 251 has a stacked structure, the uppermost layer of the stacked structure, for example, is formed as a layer having a lower etching rate than the underlying layer, thereby making it possible to use the uppermost layer as the etching mask 252.

Figure 10:
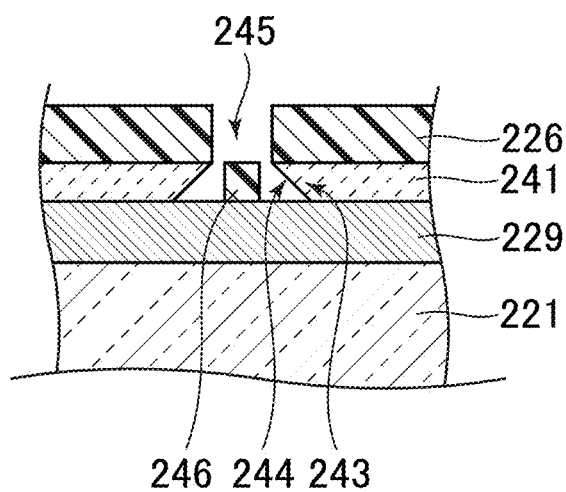
FIG. 10 is a diagram for explaining an organic layer deposition step in FIG. 8.

Returning back to FIG. 8, in an organic layer deposition step S104, the organic layer 226 is deposited by vapor deposition without a vapor deposition mask over the display area D and the outside area F. Here, the organic layer 226 in the display area D is composed of the plurality of layers, and at least a portion of the plurality of layers may be deposited without a vapor deposition mask also in the outside area F. In the contact hole 245 of the outside area F, as shown in FIG. 10, since the organic layer 226 is not vapor-deposited below the tapered portion 243, the organic layer 226 is disconnected at a step and deposited with the contact hole 245 to the wire 229 retained therein. Here, the island-shaped portion 246 may be formed on the wire 229 between the tapered portions 243 facing each other, and the island-shaped portion 246 may not be formed depending on the width of the tapered portions 243 facing each other or other deposition conditions. Since the organic layer 226 is disconnected at a step as described above, a path of moisture entering from the outside of the device into the display area D is eliminated, making it possible to prevent a display defect due to moisture, such as a dark spot.

Next, in an upper electrode forming step S105, the upper electrode 227 composed of a transparent conductive film is deposited by sputtering over the display area D and the outside area F. The upper electrode 227 extends into and fills the contact hole 245 due to the characteristics of sputtering, and contacts the wire 229. When the island-shaped portion 246 is formed, the upper electrode 227 also covers the island-shaped portion 246. Subsequently, in a sealing film forming step S106, the sealing film 228 composed of an inorganic insulating film or the like is formed over the display area D and the outside area F (FIG. 4).

In an external terminal forming step S107, terminals for connecting the driver IC 260 or an FPC (Flexible Printed Circuit) are exposed in a surface of the TFT substrate 220. In this case, the sealing film 228, the upper electrode 227, and the organic layer 226 are stripped by wet etching or dry etching, in which the organic layer 226 formed in the outside area F functions as a release layer. Therefore, the sealing film 228 and the upper electrode 227 are easily stripped, which makes it easy to expose wires or the like serving as external terminals. Although dry etching or wet etching is used in the external terminal forming step S107, external terminals may be formed in another step without using this step. Moreover, the external terminal forming step S107 may not be carried out in the TFT substrate deposition step S100.

As has been described above, according to the embodiment, since at least a portion of the layers of the organic layer 226 can be deposited without a vapor deposition mask over the display area D and the outside area F, it is possible to reduce the number of times of use of a vapor deposition mask that is expensive and needs to be regularly cleaned and exchanged, simplify the manufacturing step, and reduce the manufacturing cost. Moreover, the organic EL display device 100 according to the embodiment can be manufactured at reduced cost.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An organic EL display device comprising:
    a plurality of pixels disposed in a matrix in a display area;
    a lower electrode disposed in each of the plurality of pixels and composed of a conductive material;
    an upper electrode disposed so as to cover the whole of the display area and composed of a conductive material;
    an organic layer disposed between the lower electrode and the upper electrode and composed of a plurality of layers including a light-emitting layer composed of an organic material;
    a wire formed outside the display area and composed of conductive material; and
    a tapered structure layer formed on the wire and including a contact hole having a tapered side surface portion, wherein
    the wire includes an exposed portion exposed through the contact hole,
    the side surface portion extends so as to overhang the exposed portion,
    at least one layer of the organic layer is formed on the tapered structure layer, and
    the upper electrode is in contact with the wire through the contact hole.

2. The organic EL display device according to claim 1, further comprising an island-shaped portion disposed on the exposed portion, having a layer configuration of at least one layer of the organic layer, and covered with the upper electrode.

3. The organic EL display device according to claim 1, wherein
    the tapered structure layer and the lower electrode are simultaneously formed.

4. The organic EL display device according to claim 1, wherein
    a plurality of the contact holes are formed.

5. The organic EL display device according to claim 4, wherein
    the plurality of contact holes each have a strip shape extending in one direction, and are arranged in parallel.

6. The organic EL display device according to claim 4, wherein
    the plurality of contact holes are disposed in a matrix.

7. The organic EL display device according to claim 1, wherein
    the contact hole has a first opening located on the side of the wire and a second opening facing the first opening, and
    the first opening is larger than the second opening.

* * * * *